(12) United States Patent
Cheng et al.

(10) Patent No.: US 11,765,987 B2
(45) Date of Patent: Sep. 19, 2023

(54) PHASE CHANGE MEMORY DEVICE BASED ON NANO CURRENT CHANNEL

(71) Applicant: HUAZHONG UNIVERSITY OF SCIENCE AND TECHNOLOGY, Hubei (CN)

(72) Inventors: Xiaomin Cheng, Hubei (CN); Han Li, Hubei (CN); Yuntao Zeng, Hubei (CN); Yunlai Zhu, Hubei (CN); Xiangjun Liu, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/642,706

(22) PCT Filed: Jan. 5, 2021

(86) PCT No.: PCT/CN2021/070271
§ 371 (c)(1),
(2) Date: Mar. 14, 2022

(87) PCT Pub. No.: WO2022/134211
PCT Pub. Date: Jun. 30, 2022

(65) Prior Publication Data
US 2023/0099931 A1    Mar. 30, 2023

(30) Foreign Application Priority Data
Dec. 25, 2020 (CN) .......................... 202011565602.3

(51) Int. Cl.
*H10N 70/00* (2023.01)
*H10N 70/20* (2023.01)

(52) U.S. Cl.
CPC ......... *H10N 70/828* (2023.02); *H10N 70/066* (2023.02); *H10N 70/231* (2023.02);
(Continued)

(58) Field of Classification Search
CPC .................................................. H10N 70/8616
See application file for complete search history.

(56) References Cited

U.S. PATENT DOCUMENTS

| 2002/0114974 A1 | 8/2002 | Carey et al. |
| 2005/0167645 A1 | 8/2005 | Kim et al. |

(Continued)

FOREIGN PATENT DOCUMENTS

| CN | 101295729 | 10/2008 |
| CN | 101425559 | 5/2009 |
| CN | 102386323 | 3/2012 |

OTHER PUBLICATIONS

B. Abeles, et al., "Percolation Conductivity in W-Al2O3 Granular Metal Films," Phys. Rev. Lett., vol. 35, No. 4, Jul. 1975, pp. 1-5.
(Continued)

*Primary Examiner* — Mounir S Amer
(74) *Attorney, Agent, or Firm* — JCIPRNET (57) ABSTRACT

A phase change memory device based on a nano current channel is provided. A nano current channel layer structure is adopted and configured to limit the current channel. As such, when flowing through the layer, the current enters the phase change layer from nano crystal grains with high electrical conductivity, and the current is thereby confined in the nano current channels. By using the nano-scale conductive channels, the contact area between the phase change layer and the electrode layer is significantly decreased, the current density at local contact channel is significantly increased, and heat generation efficiency of the current in the phase change layer is improved. Moreover, an electrically
(Continued)

insulating and heat-insulating material with low electrical conductivity and low thermal conductivity prevents heat in the phase change layer from being dissipated to the electrode layer, and Joule heat utilization efficiency of the phase change layer is thereby improved.

15 Claims, 9 Drawing Sheets

(52) U.S. Cl.
CPC ....... *H10N 70/841* (2023.02); *H10N 70/8616* (2023.02); *H10N 70/8828* (2023.02)

(56) References Cited

U.S. PATENT DOCUMENTS

| | | |
|---|---|---|
| 2005/0184282 A1 | 8/2005 | Lai et al. |
| 2006/0192246 A1* | 8/2006 | Jeon ............... H01L 29/792 257/E21.21 |
| 2017/0221813 A1* | 8/2017 | Kim ............... H01L 28/00 |

OTHER PUBLICATIONS

"International Search Report (Form PCT/ISA/210) of PCT/CN2021/070271," dated May 25, 2021, pp. 1-4.

"Written Opinion of the International Searching Authority (Form PCT/ISA/237) of PCT/CN2021/070271," dated May 25, 2021, pp. 1-3.

* cited by examiner

PHASE CHANGE MEMORY DEVICE BASED ON NANO CURRENT CHANNEL

CROSS-REFERENCE TO RELATED APPLICATION

This application is a 371 of international application of PCT application serial no. PCT/CN2021/070271, filed on Jan. 5, 2021, which claims the priority benefit of China application no. 202011565602.3, filed on Dec. 25, 2020. The entirety of each of the above mentioned patent applications is hereby incorporated by reference herein and made a part of this specification.

TECHNICAL FIELD

The disclosure belongs to a field of phase change memory technology, and in particular, relates to a phase change memory device based on a nano current channel.

DESCRIPTION OF RELATED ART

With the advent of the information age, memory devices become important in daily life. At present, the research of memory devices has been developing towards high speed, low power consumption, and high stability. In the semiconductor market, the phase change memory (PCRAM) based on the phase-change materials exhibits huge potential.

The basic principle of the phase change memory device is that the phase change material may be reversibly switched between the crystalline state and the amorphous state. The significant difference in resistance between the different states of the material is used to realize the data storage of "1" and "0". The commonly used phase change materials are chalcogenide compounds. By controlling the amplitude and pulse width of the applied current pulse, the phase transition of a chalcogenide compound between the crystalline state and the amorphous state may be easily controlled. Through the measurement of resistance, the binary data stored in the phase change memory device may be read out. The phase change memory device exhibits advantages such as fast reading and writing speed, high storage density, and compatibility with conventional CMOS process.

Among all currently-available new memory technologies, the phase change memory device is positioned to replace DRAM. At present, although the speed of phase change memory device has reached the speed of DRAM, its power consumption still needs to be further reduced. Especially in the case of further increasing the integration level such as 3D storage, reducing the power consumption of the phase change memory cell is also beneficial to reducing the thermal crosstalk between the cells.

In the phase change memory device, the internal temperature of the device is changed based on the thermal effect of the current, so as to achieve the reversible switching of the phase change material between the crystalline state and the amorphous state. Therefore, the write current of the PCRAM cell is proportional to the amount of material involved in the phase change process. The smaller the cell size, the lower the write power consumption of the cell. In addition, under the condition that the size of the device cell remains unchanged, strict control of the heat generation efficiency of the write current (increasing the current density of the phase change area, improving the heating efficiency of the phase change material, lowering its melting temperature, etc.) and heat dissipation conditions is also beneficial to reduction of power consumption of the device.

Current methods for reducing the power consumption of a phase change memory cell are mainly divided into two categories. One category is the use of a new and low power consumption phase change material featuring high heating efficiency and low melting temperature, and the other category is to change the device structure. The most direct way to change the device structure is to reduce the size of the device, and in this way, the amount of phase change material is reduced and the current density is increased (e.g., a confined phase change memory cell structure). However, this method requires more advanced processes and thus is costly and difficult. As for other methods configured for changing the device structure (e.g., edge contact type, asymmetric structure, ring electrode structure, addition of a two-dimensional material thermal barrier layer, etc.), all of these methods are aimed to lower the RESET power consumption produced by the phase change cell through minimizing the amount of material involved in the phase change as much as possible or through reducing the heat dissipation of the device without moving forward to more advanced process. However, among all these methods, considerable changes are required to be made to the device structure and process, and problems such as high process costs and great process difficulty are found as well.

SUMMARY

In view of the defects of the related art, the disclosure provides a phase change memory device based on a nano current channel aiming to solve the problems of high process costs and great process difficulty caused by reduction of RESET power consumption through changing a structure of a device, and in this way, current density of the contact area is increased, heat generation efficiency is improved, and heat utilization efficiency is raised. Therefore, the RESET power consumption generated by the phase change memory device may be reduced without reducing the cell size and without moving forward to more complicated process.

The disclosure provides a phase change memory device based on a nano current channel, and the phase change memory device includes a nano current channel layer disposed between the phase change layer and the electrode layer. The nano current channel layer is an electrically insulating and heat-insulating layer containing metal nano crystal grains penetrating the thickness of the layer. The metal nano crystal grains directly connect with the electrode layer and the phase change layer. The current reaches the phase change layer from the electrode layer only through the nano current channels formed by the metal nano crystal grains. The phase change layer electrically connects the electrode layer only through the metal nano crystal grains. The contact area between the phase change layer and the electrode layer is effectively decreased, Joule heat utilization efficiency in the phase change layer is improved, and power consumption of a device is lowered.

The nano current channel formed by the metal nano crystal grains reduces the contact area between the phase change layer and the electrode layer and increases local current density, so as to improve the heat generation efficiency; and the electrically insulating and heat-insulating material part of the nano current channel layer may prevent heat from dissipating from the phase change layer to the electrode layer, so as to provide a thermal barrier effect. Therefore, the addition of the nano current channel layer can significantly lower the power consumption of phase change memory device.

Herein, the nano current channel layer is a film structure formed by an electrically insulating and heat-insulating material and the metal nano crystal grains embedded in the electrically insulating and heat-insulating material. The metal nano crystal grains penetrate the layer to form the nano current channels.

Furthermore, the phase change memory device further includes: a first electrode layer, a second electrode layer, and a phase change material layer. The first electrode layer is adjacent to the phase change material layer, the phase change material layer is adjacent to the nano current channel layer, and the second electrode layer is adjacent to the nano current channel layer. The nano current channel layer is a single insulating layer containing the metal nano crystal grains penetrating the entire layer.

Herein, the material of the metal nano crystal grains is at least one of elementary metal materials selected from Fe, Pt, W, Cu, Zn, Al, Ni, Ti, Au, and Ag, or is an alloy material formed of any two or more of elementary metal materials selected from Fe, Pt, W, Cu, Zn, Al, Ni, Ti, Au, and Ag, or is a compound with good conductivity containing an elementary metal material selected from Fe, Pt, W, Cu, Zn, Al, Ni, Ti, Au, and Ag.

Furthermore, the metal nano crystal grains of the nano current channel layer exhibit larger electrical conductivity than the electrically insulating and heat-insulating material.

Furthermore, the electrically insulating and heat-insulating material has low thermal conductivity, and the electrically insulating and heat-insulating material is any one of silicon oxide, silicon nitride, aluminum oxide, aluminum nitride, zinc oxide, tungsten oxide, titanium oxide, boron nitride, and silicon carbide.

Furthermore, the thickness of the nano current channel layer is 1 nm to 30 nm.

Furthermore, the size of the metal nano crystal grains in the insulating layer is 1 nm to 30 nm, and the size of the metal nano crystal grains in the direction perpendicular to film surface is not less than the thickness of the nano current channel layer.

Furthermore, the phase change material layer includes chalcogenide compound, and the chalcogenide compound includes alloy compound formed by any one of S, Se and Te, and other non-chalcogenide materials. The non-chalcogenide materials include one or more of Ge, Sb, Ga, Bi, In, Sn, Pb, Ag, N, and O.

The phase change material layer includes GeTe, GeSb, $Ge_2Sb_2Te_5$, $Ge_1Sb_2Te_4$, $Sb_2Te_3$, AgInSbTe, and superlattice-like phase change material or heterostructure phase change material, including $(GeTe)/(Sb_2Te_3)$, $(GeTe)/(Bi_2Te_3)$, $(Sb_2Te_3)/(TiTe_2)$, GeTe/Sb, (Ge—Sb—Te)/(Sb—Te), or (Ge—Sb—Te)/C.

The phase change material layer includes compound formed by doping or modifying chalcogenide compound, and the dopant element includes at least one of C, N, O, Cu, Cr, Sc, and Ti.

Herein, the phase change material layer includes single element phase change material Sb or Te.

Furthermore, the thickness of the phase change material layer is 20 nm to 200 nm.

Furthermore, the material of the first electrode layer and the material of the second electrode layer include metal elementary substances such as Au, Ta, Pt, Al, W, Ti, Cu, Ir, a metal alloy thereof, and a metal compound such as TiW, TiN.

Herein, the thicknesses of the first electrode layer and the second electrode layer are 20 nm to 300 nm.

Compared with using more advanced manufacturing process to make phase change memory cells as small as possible, the disclosure may break through the process limitation. Under a certain manufacturing process, the effective contact area between the electrode and the phase change material is further reduced, the current density in the contact area is greatly increased, and the heat generation efficiency is improved. Moreover, heat loss can be effectively reduced through the adoption of the electrically insulating and heat-insulating material with low thermal conductivity in the nano current channel layer, and thermal efficiency is improved. As the effective contact area decreases, the volume of the phase change region is correspondingly reduced, and the total energy required for phase transition becomes lower as well. Therefore, the RESET power consumption in the phase change memory device can be reduced without reducing the cell size and without moving forward to more advanced process.

Besides, compared with other methods configured for changing the device structure (e.g., edge contact type, asymmetric structure, ring electrode structure, addition of a two-dimensional material as thermal barrier layer, etc.), in the disclosure, the device structure is not required to be significantly changed, and only the nano current channel layer is required to be added. The method of preparing the nano current channel layer is simple and is compatible with that of preparing the phase change layer, while the power consumption of the device is considerably lowered.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure.

The disclosure provides a phase change memory device based on a nano current channel. Specifically, a nano current channel layer is inserted between the electrode layer and the phase change layer in the phase change memory device. Regarding the nano current channel layer, metal or metal compounds clusters with high electrical conductivity grow and aggregate in an electrically insulating and heat-insulating material with low electrical conductivity and low thermal conductivity to form nano crystal grains. When growing under specific process conditions, the nano crystal grains may penetrate the insulating layer to form the conductive nano current channels. The nano current channel layer is configured to limit the current flowing area. In this way, when flowing through the layer, the current enters the phase change layer only through the nano crystal grains with high electrical conductivity, and the current is thereby limited in the nano current channels. By employing the nano-scale conductive channels, the contact area between the phase change layer and the electrode layer is significantly decreased, the current density of the local conducting portion is significantly increased, and the heat generation efficiency of the current in phase change layer is improved. Besides, in the nano current channel layer, the part other than the nano crystal grains with high electrical conductivity is the electrically insulating and heat-insulating material with low electrical conductivity and low thermal conductivity, and the low thermal conductivity prevents heat in the phase change layer from dissipating to the electrode layer. Accordingly, a thermal barrier effect is provided, electric heat utilization efficiency of the phase change layer is improved and the RESET power consumption of the device is further lowered.

In an embodiment of the disclosure, the structure of the phase change memory device using a nano current channel layer provided by the disclosure sequentially includes the following:

the first electrode layer, adjacent to the phase change material layer;
the phase change material layer;
the nano current channel layer, adjacent to the phase change material layer, and being a single insulating layer containing metal nano crystal grains penetrating the entire layer; and
the second electrode layer adjacent to the nano current channel layer.

Herein, the nano current channel layer is a film structure formed by an electrically insulating and heat-insulating material and the metal nano crystal grains embedded in the electrically insulating and heat-insulating material. The metal nano crystal grains penetrate the layer to form the nano current channels.

Herein, the material of the metal nano crystal grains includes metal elementary substances, a metal compound, and a metal alloy.

Preferably, the material of the metal nano crystal grains is at least one of elementary metal materials selected from Fe, Pt, W, Cu, Zn, Al, Ni, Ti, Au, and Ag, or is an alloy material formed by any two or more of elementary metal materials selected from Fe, Pt, W, Cu, Zn, Al, Ni, Ti, Au, and Ag, or is a compound with good conductivity containing elementary metal material selected from Fe, Pt, W, Cu, Zn, Al, Ni, Ti, Au, and Ag.

The electrically insulating and heat-insulating material is at least one of silicon oxide, silicon nitride, aluminum oxide, aluminum nitride, zinc oxide, tungsten oxide, titanium oxide, boron nitride, and silicon carbide. The electrically insulating and heat-insulating material requires to exhibit low thermal conductivity.

Herein, the thickness of the nano current channel layer is 1 nm to 30 nm. The size of the metal nano crystal grains in the insulating layer is 1 nm to 30 nm, and the size of the metal nano crystal grains in the direction perpendicular to film surface is not less than the thickness of the nano current channel layer.

The phase change material layer includes chalcogenide compounds and single element phase change materials.

Preferably, the chalcogenide compounds include an alloy compound formed by one of S, Se, and Te and other non-chalcogenide elements, and the non-chalcogenide elements include one or more of Ge, Sb, Ga, Bi, In, Sn, Pb, Ag, N, and O.

Preferably, the chalcogenide compound includes GeTe, GeSb, $Ge_2Sb_2Te_5$, $Ge_1Sb_2Te_4$, $Sb_2Te_3$, and AgInSbTe.

More preferably, the chalcogenide compounds include compounds formed by doping or modifying the above alloy compound, and the dopant elements include at least one of C, N, O, Cu, Cr, Sc, and Ti.

The phase change material layer further includes superlattice-like phase change material or heterostructure phase change material containing chalcogenide compounds including (GeTe)/($Sb_2Te_3$), (GeTe)/($Bi_2Te_3$), ($Sb_2Te_3$)/($TiTe_2$), GeTe/Sb, (Ge—Sb—Te)/(Sb—Te), or (Ge—Sb—Te)/C.

The phase change material layer further includes a single element phase change material such as Sb or Te.

According to another aspect of the disclosure, a method of selecting, matching, and preparing the material of the nano current channel layer is also provided. In the method, with the use of VASP, Materials Studio, LAMMPS or other software, the mean square displacement, formation energy or radial distribution function of metal atoms in the electrically insulating and heat-insulating material are calculated based on First Principle and molecular dynamics so as to select metal elementary substances and metal alloy matched with the electrically insulating and heat-insulating material.

According to another aspect of the disclosure, a method of preparing the nano current channel layer and the phase change memory device containing the nano current channel layer is provided. In the method, any one of the magnetron sputtering method, chemical vapor deposition method, plasma enhanced chemical vapor deposition method, physical vapor deposition method, laser pulse deposition method, evaporation method, electrochemical growth method, ion implantation method, molecular beam epitaxy method, atomic vapor deposition method, and atomic layer deposition method is adopted.

The method of preparing the phase change memory device with a nano current channel layer is further provided by the disclosure, and the method aims to increase the local current density without reducing the device size such that the phase transition may be completed in the phase change layer, and the RESET power consumption of the device may be lowered.

In order to further illustrate the phase change memory device based on the nano current channel provided by the embodiments of the disclosure, description is provided in detail as follows in combination with specific examples.

Example 1

Figure 1:
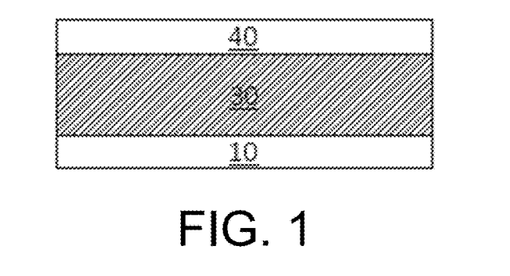
FIG. 1 illustrates a cross-sectional view of an exemplary structure of conventional phase change memory device.

According to Example 1 of the disclosure, a cross-sectional view of an exemplary structure of conventional phase change memory device is shown in FIG. 1.

A bottom electrode 10 is formed on $SiO_2$ substrate. The material of the bottom electrode 10 is selected from metal materials such as W, Pt, Au, Al, Cu, Ti, and Ta and conductive materials of alloy thereof. The phase change material layer 30 is formed on the bottom electrode 10, and the phase change material layer 30 includes a chalcogenide compound. Preferably, the chalcogenide compound includes an alloy compound formed by one of S, Se, and Te and other non-chalcogenide materials, and the non-chalcogenide materials include one or more of Ge, Sb, Ga, Bi, In, Sn, Pb, Ag, N, and O. Preferably, the chalcogenide compound includes GeTe, GeSb, $Ge_2Sb_2Te_5$, $Ge_1Sb_2Te_4$, $Sb_2Te_3$, AgInSbTe. More preferably, the chalcogenide compound includes a compound formed by doping or modifying the alloy compound, and the dopant element includes at least one of C, N, O, Cu, Cr, Sc, and Ti. The phase change material layer further includes superlattice-like phase change material or heterostructure phase change material containing a chalcogenide compound including (GeTe)/($Sb_2Te_3$), (GeTe)/($Bi_2Te_3$), ($Sb_2Te_3$)/($TiTe_2$), GeTe/Sb, (Ge—Sb—Te)/(Sb—Te), or (Ge—Sb—Te)/C. The phase change material layer further includes a single element phase change material such as Sb, Te. A top electrode 40 is formed on the phase change material layer 30, and the material of the top electrode 40 is selected from metal materials such as W, Pt, Au, Al, Cu, Ti, and Ta and conductive materials of alloy thereof.

Figures 2, 3A:
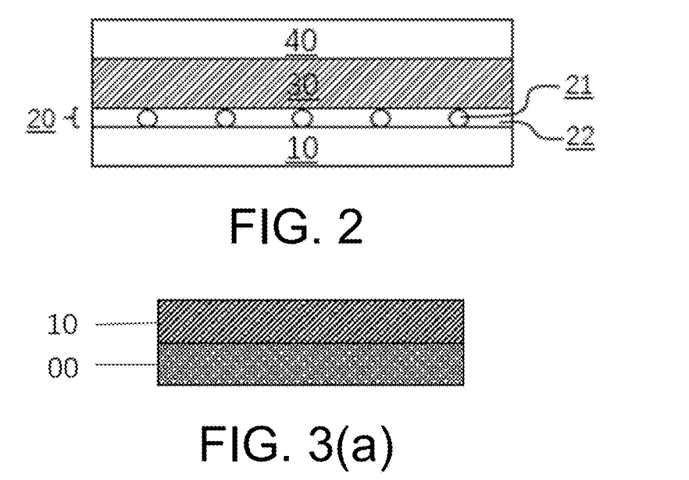
FIG. 2 illustrates a cross-sectional view of the exemplary structure of the phase change memory device with a nano current channel layer provided in Example 1.
FIG. 3(a) to FIG. 3(i) illustrate the process flow of preparing a device structure containing a nano current channel layer in Example 3 according to the disclosure.

According to Example 1 of the disclosure, a cross-sectional view of an exemplary structure of a phase change memory device with a nano current channel layer is shown in FIG. 2. The bottom electrode 10 is formed on the $SiO_2$ substrate, and the material of the bottom electrode 10 is selected from metal materials such as W, Pt, Au, Al, Cu, Ti, and Ta and conductive materials of alloy thereof. A nano current channel layer 20 is formed on the bottom electrode 10, and the nano current channel layer 20 is formed by an electrically insulating and heat-insulating material 22 and conductive nano crystal grains 21 embedded in the layer of the electrically insulating and heat-insulating material 22. Herein, the thickness of the nano current channel layer 20 is 1 nm to 30 nm. The size of the conductive nano crystal grains in the insulating layer is 1 nm to 30 nm, and the size of the conductive nano crystal grains 21 in the direction perpendicular to film surface is not less than the thickness of the nano current channel layer 20. Compared to the electrically insulating and heat-insulating material 22, the conductive nano crystal grains 21 have less electrical resistivity. The phase change material layer 30 is formed on the nano current channel layer 20, and the phase change material layer 30 includes a chalcogenide compound. Preferably, the chalcogenide compound includes an alloy compound formed by one of S, Se, and Te and other non-chalcogenide materials, and the non-chalcogenide materials include one or more of Ge, Sb, Ga, Bi, In, Sn, Pb, Ag, N, and O. Preferably, the chalcogenide compound includes GeTe, GeSb, $Ge_2Sb_2Te_5$, $Ge_1Sb_2Te_4$, $Sb_2Te_3$, AgInSbTe. More preferably, the chalcogenide compound includes a compound formed by doping or modifying the alloy compound, and the dopant element includes at least one of C, N, O, Cu, Cr, Sc, and Ti. The phase change material layer further includes superlattice-like phase change material or heterostructure phase change material containing chalcogenide compound including (GeTe)/($Sb_2Te_3$), (GeTe)/($Bi_2Te_3$), ($Sb_2Te_3$)/($TiTe_2$), GeTe/Sb, (Ge—Sb—Te)/(Sb—Te), or (Ge—Sb—Te)/C. The phase change material layer further includes single element phase change material such as Sb, Te. The top electrode 40 is formed on the phase change material layer 30, and the material of the top electrode 40 is selected from metal materials such as W, Pt, Au, Al, Cu, Ti, and Ta and conductive materials of alloy thereof.

The figure in Example 1 shows the simplest three-layer phase change memory cell structure, but such a structure is not limited to the three-layer structure, and the structure may also be a T-type structure or a confined structure and may also be a phase change memory cell structure with an additional selector.

Example 2

According to Example 2 of the disclosure, RESET processes of the phase change memory device structure with a nano current channel layer and the conventional phase change memory device structure are simulated by finite element analysis.

The simulation adopts the simplest three-layer phase change memory cell structure in Example 1. Material parameters used in the simulation are listed in Table 1 (thermal and electrical parameters of various materials used in the finite element analysis). The materials of top and bottom electrodes of the two cell structures are both Pt, the insulating material between the cells is $SiO_2$, and the phase change layer is made of $Ge_2Sb_2Te_5$. Thicknesses of the top and bottom electrodes, the insulating layer, and the phase change layer are all 100 nm, and the diameter of the device is 100 nm. In the structure with the nano current channel layer, the thickness of the nano current channel layer is set to 5 nm. $SiO_2$ material is used as the electrically insulating and heat-insulating part of the layer, and Ag grains are used as the nano current channel with the diameter of 6 nm. RESET current pulse with an amplitude of 60 uA and a pulse width of 50 ns is applied to the two structural models individually.

TABLE 1

| | Thermal Conductivity (W/m/K) | Density (kg/m3) | Constant Pressure Heat Capacity (J/kg/K) | Conductivity S/m | Relative Permittivity |
|---|---|---|---|---|---|
| $Ge_2Sb_2Te_5$ | 0.2 | 6000 | 208 | 4000 | 35 |
| $SiO_2$ | 1.38 | 2203 | 703 | $1 \times 10^{-16}$ | 12 |
| Pt | 22 | 12000 | 240 | $1 \times 10^7$ | 1 |
| Ag | 429 | 10490 | 232 | $6.3 \times 10^7$ | 1 |

Highest temperatures and maximum current densities in the phase change layers in two different structures are compared after the same RESET current pulse is applied. The results show that the highest temperature in the phase change layer in the cell containing the nano current channel layer reaches 963K, the maximum current density is $5*10^9$ A/m$^2$, and the maximum current density is near the nano current channels. In the common cell structure, the highest temperature in the phase change layer is 845K, the maximum current density is $9*10^8$ A/m$^2$, and the current density is more evenly distributed in Ge$_2$Sb$_2$Te$_5$. From this analysis, it can be seen that the maximum temperature in the device containing the nano current channel layer structure may reach higher than that in common structure under the same current pulse stimulation. This shows that the RESET operation on the phase change memory device with the nano current channel layer may be completed with lower power consumption, and the advantage of low power consumption is thus provided.

Example 3

According to Example 3 of the disclosure, a process of preparing a T-type phase change memory cell containing a nano current channel layer is provided as follows.

(1) SiO$_2$/Si (100) substrate is selected, sonication is applied to the SiO$_2$/Si (100) substrate in acetone solution with 40 W power for 15 minutes to clean the surface and remove dust particles and organic impurities, and the substrate is then washed with deionized water.

(2) The treated substrate is sonicated in ethanol solution with a power of 40 w for 15 minutes and then washed with deionized water, and then front and back surfaces of the substrate are blown dry with high-purity N$_2$ gas to obtain the substrate to be sputtered.

(3) As shown in FIG. 3(a), the bottom electrode 10 is grown on a substrate 00 through a magnetron sputtering method. The bottom electrode 10 is made of Pt material, and high-purity argon gas is introduced as sputtering gas during preparation. The sputtering pressure is 0.5 Pa, the power supply is 35 W, and the thickness of the bottom electrode 10 is usually 20 nm to 300 nm.

Figure 3B:
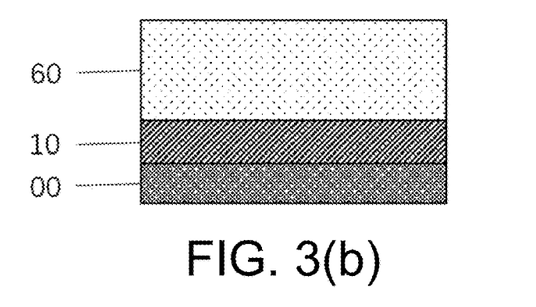

(4) As shown in FIG. 3(b), an insulating layer 60 is deposited on the bottom electrode 10 through a physical vapor deposition (PECVD) method. The insulating layer 60 is SiO$_2$ with a thickness of 100 nanometers.

Figure 3C:
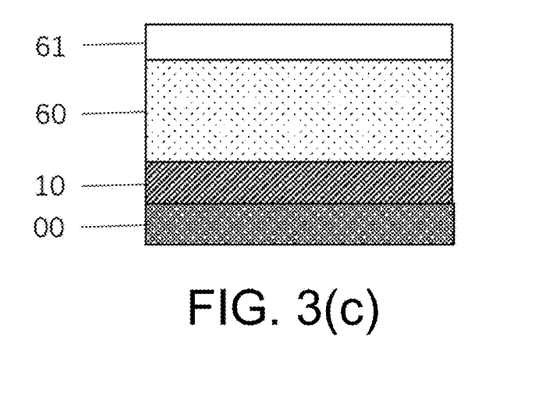
Figure 3D:
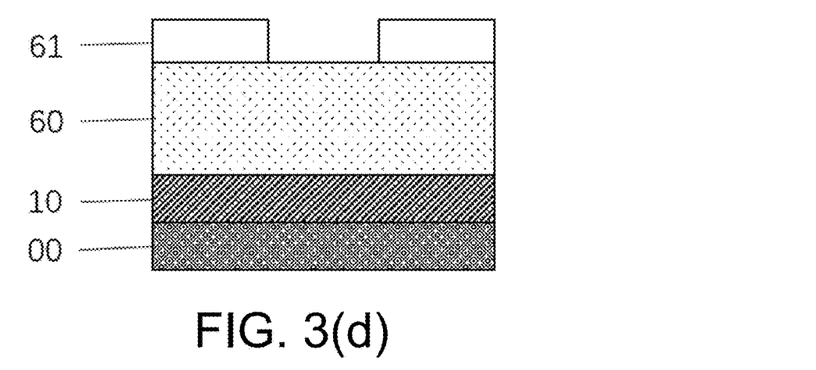

(5) As shown in FIG. 3(c), a layer of photoresist 61 is evenly spread on the insulating layer 60 by using a spin coater (6) As shown in FIG. 3(d), an electron beam lithography (EBL) system is used to form a photoresist mask 61 with a circular hole with diameter of 250 nm on the insulating layer 60.

Figure 3E:
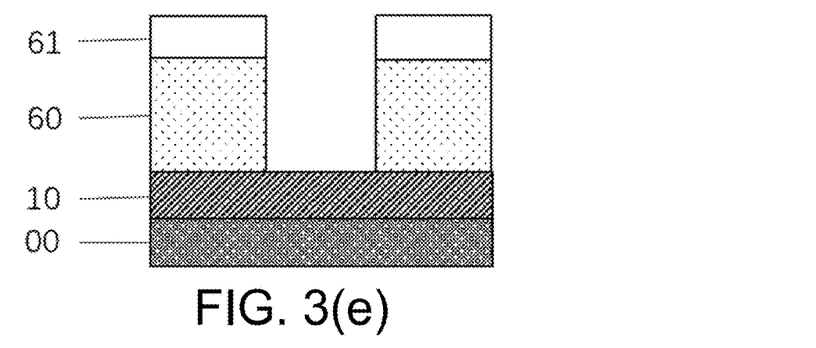

(7) As shown in FIG. 3(e), the insulating layer 60 is etched through plasma etching technology (ICP). Since the portion covered by the photoresist 61 is protected and is not be etched, the portion not covered by the photoresist 61 is exposed and etched away until the bottom electrode 10 is exposed.

Figure 3F:
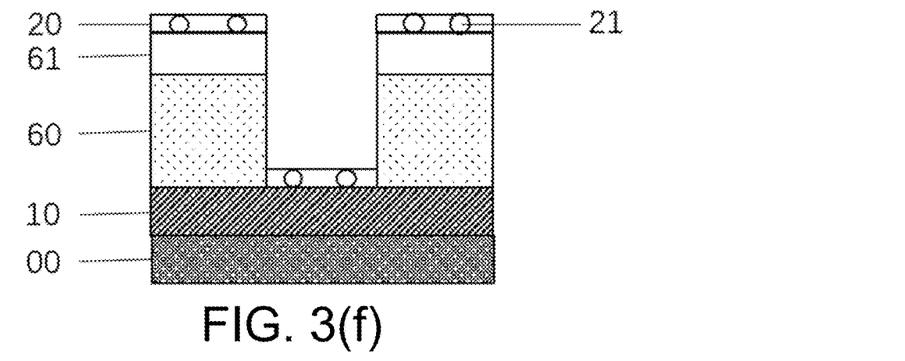

(8) As shown in FIG. 3(f), the nano current channel layer 20 is prepared by processes such as magnetron sputtering, ion implantation, and annealing. The metal nano crystal grains 21 grow and aggregate in the nano current channel layer 20 to form a conductive current channel. In this example, SiO$_2$ is selected as the electrically insulating and heat-insulating material in the nano current channel layer, and Ag is selected as the metal conductive material.

Figure 3G:
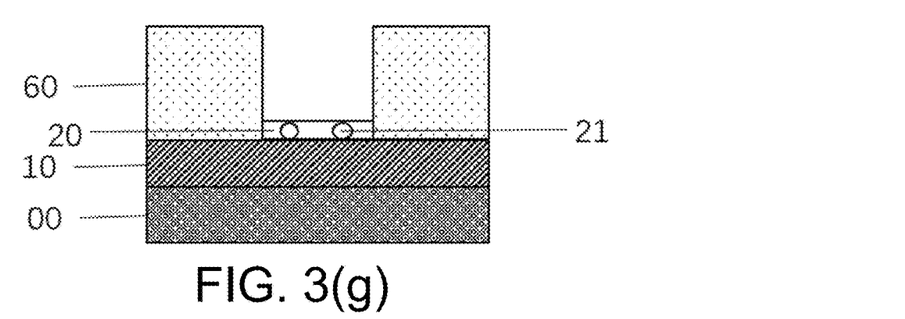

(9) The photoresist 61 is removed by degumming solution, and the final structure shown in FIG. 3(g) is obtained.

(10) An ultraviolet lithography system is used to engrave a 100 μm×100 μm square-hole structure on the small hole. The square hole is aligned with the center of the circular hole etched by ICP (not shown in the figure).

Figure 3H:
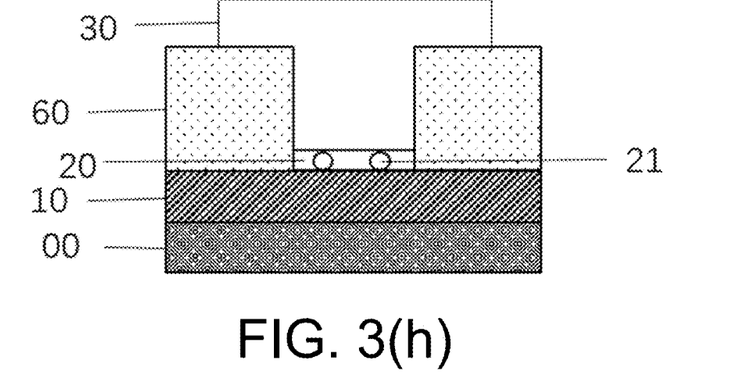

(11) As shown in FIG. 3(h), the phase change material layer 30 is deposited in the square hole by magnetron sputtering. The phase change material of the phase change material layer 30 includes a chalcogenide compound. The chalcogenide compound includes S, Se, and Te. Preferably, the chalcogenide compound includes an alloy compound formed by one of S, Se, and Te and other non-chalcogenide materials, and the non-chalcogenide materials include one or more of Ge, Sb, Ga, Bi, In, Sn, Pb, Ag, N, and O. Preferably, the chalcogenide compound includes GeTe, GeSb, Ge$_2$Sb$_2$Te$_5$, Ge$_1$Sb$_2$Te$_4$, Sb$_2$Te$_3$, AgInSbTe. More preferably, the chalcogenide compound includes a compound formed by doping or modifying the alloy compound, and the dopant element includes at least one of C, N, O, Cu, Cr, Sc, and Ti. The phase change layer material further includes superlattice-like phase change material or heterostructure phase change material containing a chalcogenide compound including (GeTe)/(Sb$_2$Te$_3$), (GeTe)/(Bi$_2$Te$_3$), (Sb$_2$Te$_3$)/(TiTe$_2$), GeTe/Sb, (Ge—Sb—Te)/(Sb—Te), or (Ge—Sb—Te)/C. The phase change material further includes single element phase change material such as Sb and Te. The phase change material used in this example is Ge$_2$Sb$_2$Te$_5$ as an instance. During preparation, high-purity argon gas is introduced as the sputtering gas, the sputtering pressure is 0.5 Pa, the power supply is 35 W, and the distance between the target and the substrate is 180 mm. The thickness of the phase change material layer 30 is 100 nm.

Figure 3I:
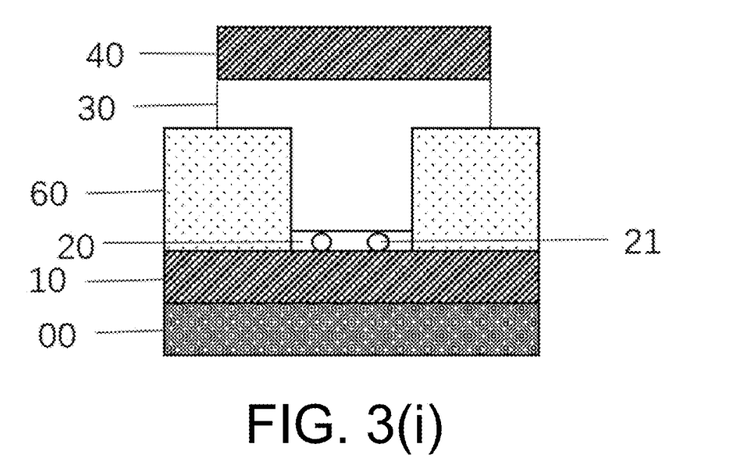

(12) The top electrode layer 40 is deposited by magnetron sputtering, and the top electrode layer is also made of the Pt metal. After completion, the photoresist of the ultraviolet lithography is removed by a lift-off process, and the final structure diagram is shown in FIG. 3(i).

Example 4

Figure 4A:
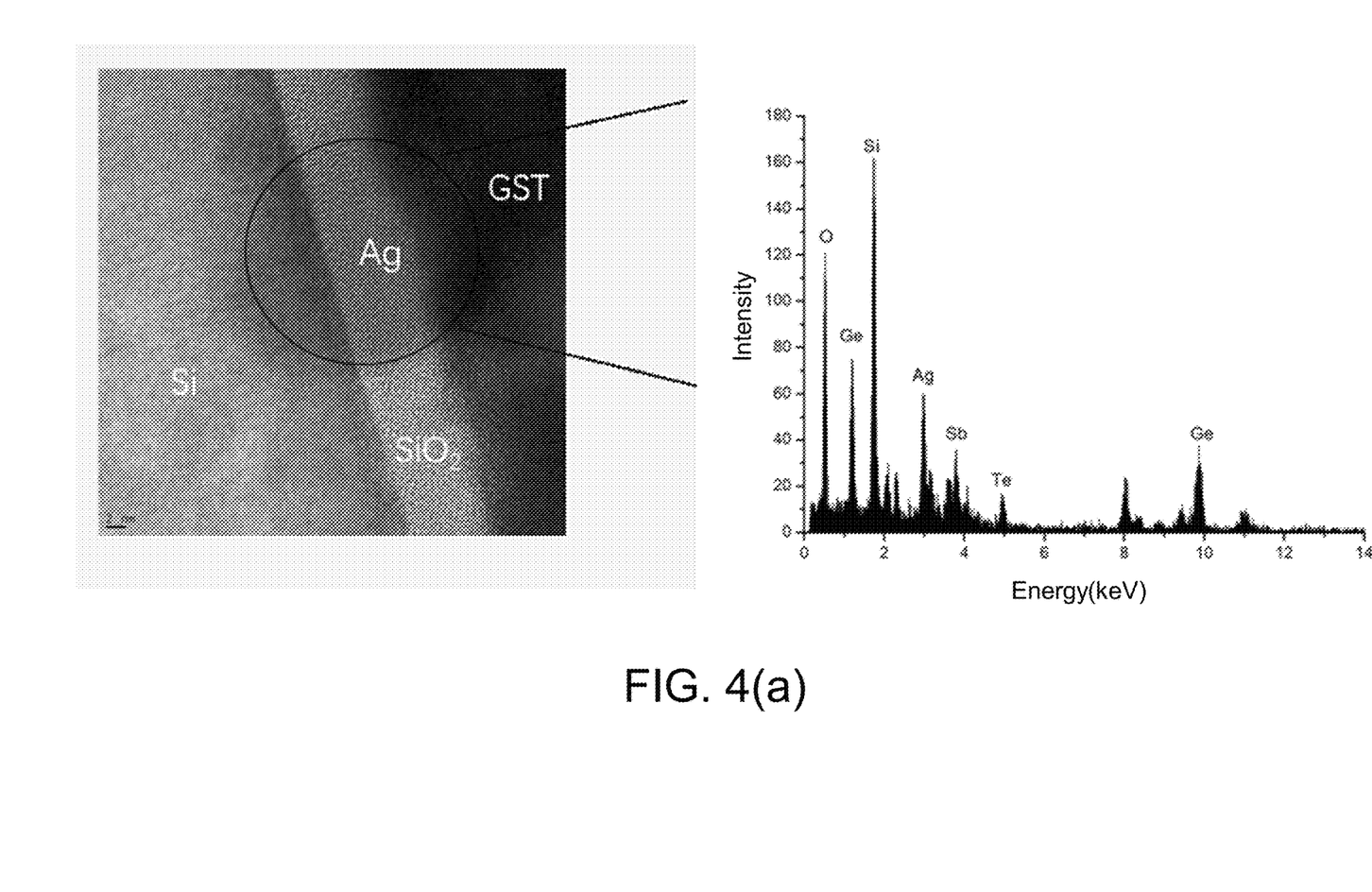
FIG. 4(a) illustrates a TEM image of a nano current channel layer (the material of the insulating portion is $SiO_2$) containing Ag crystal grains made in Example 4 according to the disclosure.

Microstructure analysis is performed on Ag-containing nano current channel layer and a high-resolution image of SiO$_2$—Ag is obtained. The thickness of the nano current channel layer is 5 nm. In FIG. 4(a), it is obvious that clusters are formed in SiO$_2$, the cluster diameter is 10 nm, and the clusters can penetrate the SiO$_2$ layer. Based on composition analysis, it can be seen that the formed clusters are Ag grains. It means that Ag grains may aggregate and grow in SiO$_2$, so that the nano current channel layer is verified, and current may be conducted from the bottom electrode layer to the phase change layer through the Ag nano crystal grains.

Figure 4B:
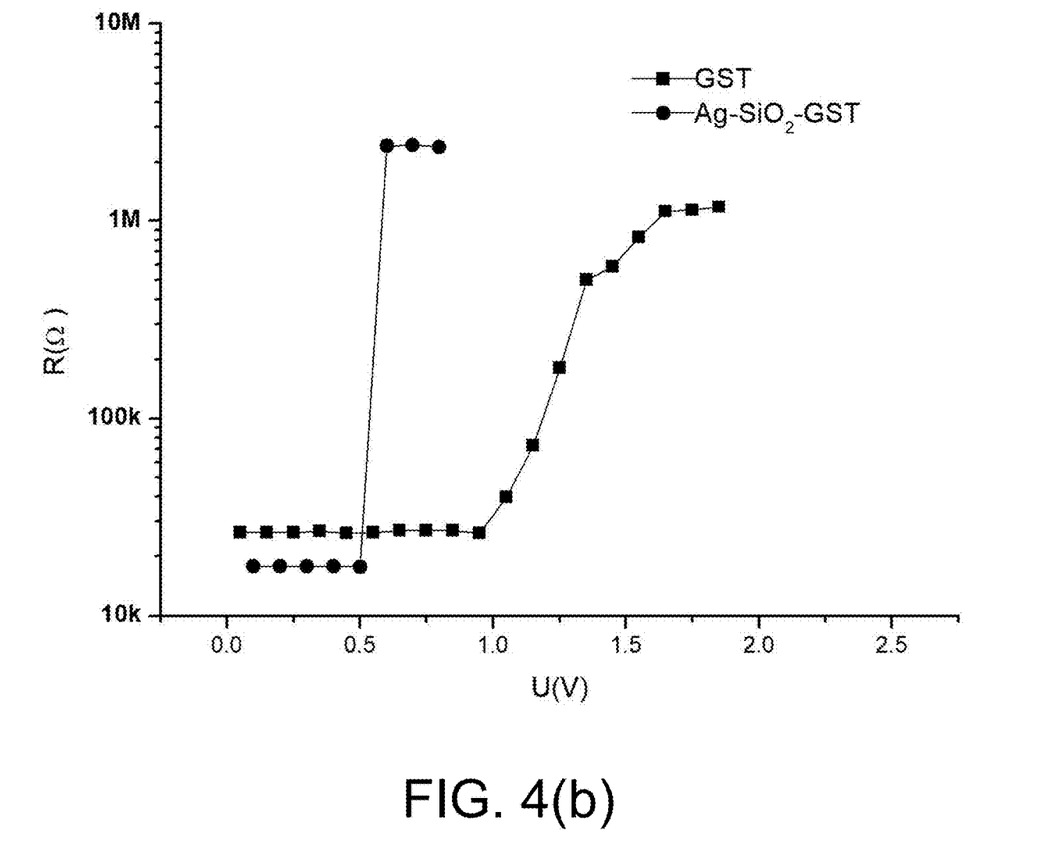
FIG. 4(b) illustrates V-R relationship curves of a phase change memory device with the nano current channel layer containing the Ag crystal grains made in Example 4 according to the disclosure and a phase change device with the same structure without the layer, where the pulse width of the applied RESET voltage pulse is 50 ns.

FIG. 4(b) shows the V-R relationship curves of RESET operations on the device containing the Ag nano current channel layer in Example 4 provided by the disclosure and on the conventional structure device (for comparison reference). Except the Ag nano current channel layer of 5 nm, the materials and structures of other layers of the two devices are completely the same. Herein, the phase change layer is made of Ge$_2$Sb$_2$Te$_5$ (GST) with thickness of 100 nm. The device has a hole diameter of 250 nm, the material of the insulating layer is SiO$_2$, the thickness thereof is 100 nm, the materials of the top and bottom electrodes are TiN, and the thicknesses thereof are 100 nm.

The RESET operation method of the devices is performed as follows. Using B1500A semiconductor tester, RESET pulses with pulse width of 50 ns, rising edge and falling edge of 10 ns, and gradually-increasing voltage amplitude are applied to the two devices. The result shows that the RESET voltage of the device containing the Ag—SiO$_2$ nano current channel layer is 0.6V, and the required power consumption is 3.3*10$^{-5}$ J, while the RESET voltage of the conventional device structure is 1.6V, and the required power consumption is 2.1*10$^{-4}$ J. The comparison between the two shows that with the current channel layer containing Ag nano crystal grains, the RESET power consumption required for phase transition may be effectively reduced.

Example 5

Figure 5A:
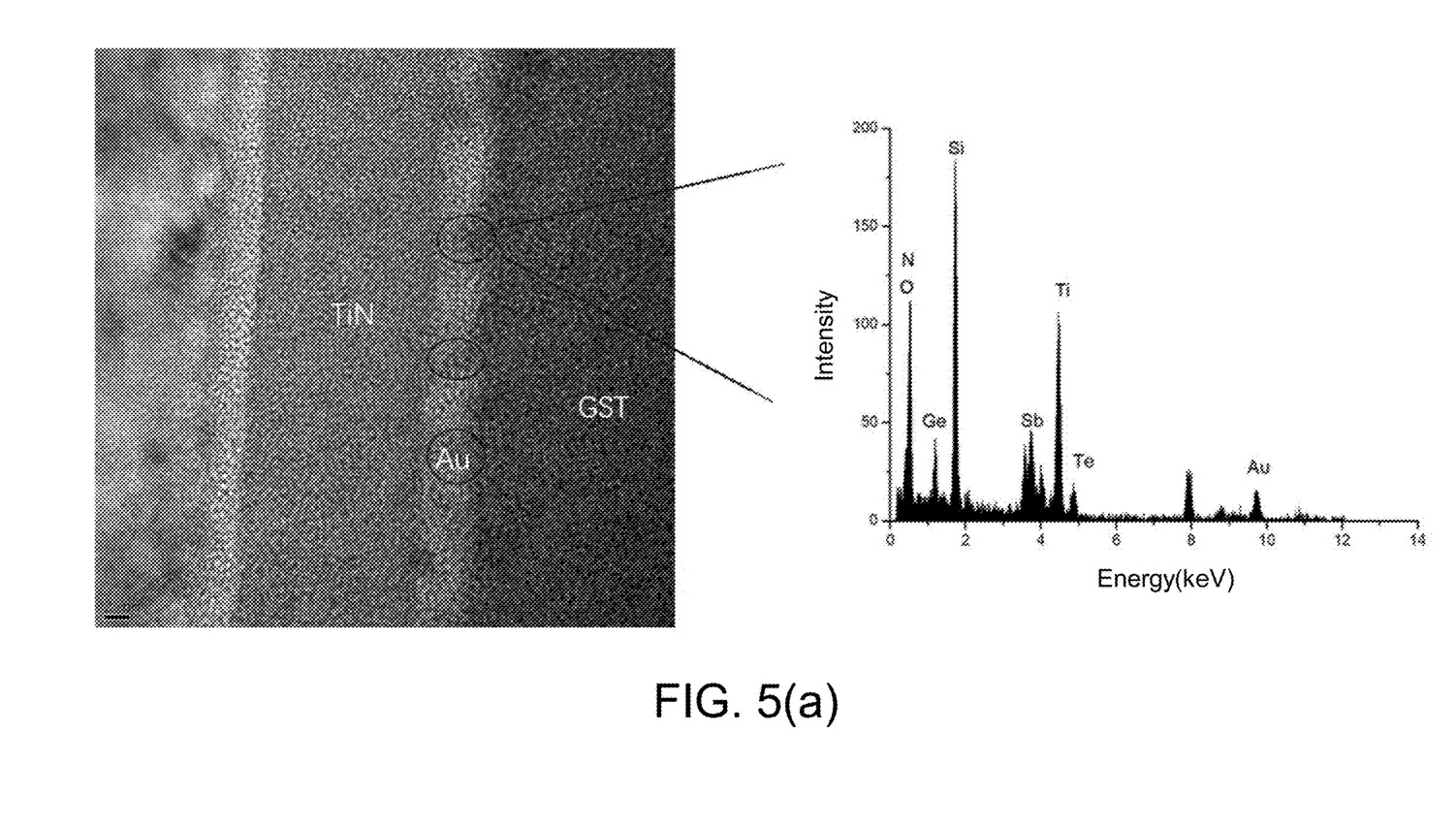
FIG. 5(a) illustrates the TEM image of a nano current channel layer (the material of the electrically insulating and heat-insulating portion is $SiO_2$) containing Au crystal grains made in Example 5 according to the disclosure.

The metal material in the nano current channel layer is changed. Microstructure analysis is performed to the current channel layer film containing Au nano crystal grains, and a high-resolution transmission electron microscope image of SiO$_2$—Au is obtained. The thickness of the nano current channel layer is 3 nm. In FIG. 5(a), it is obvious that clusters are formed in SiO$_2$, the cluster diameter is 3 nm, and the clusters can penetrate the SiO$_2$ layer. Based on composition analysis, it can be seen that the formed clusters are Au. It means that Au clusters may aggregate and grow in SiO$_2$, so that the nano current channel layer is verified, and the current may be conducted from the bottom electrode layer to the phase change layer through the Au nano crystal grains.

Figure 5B:
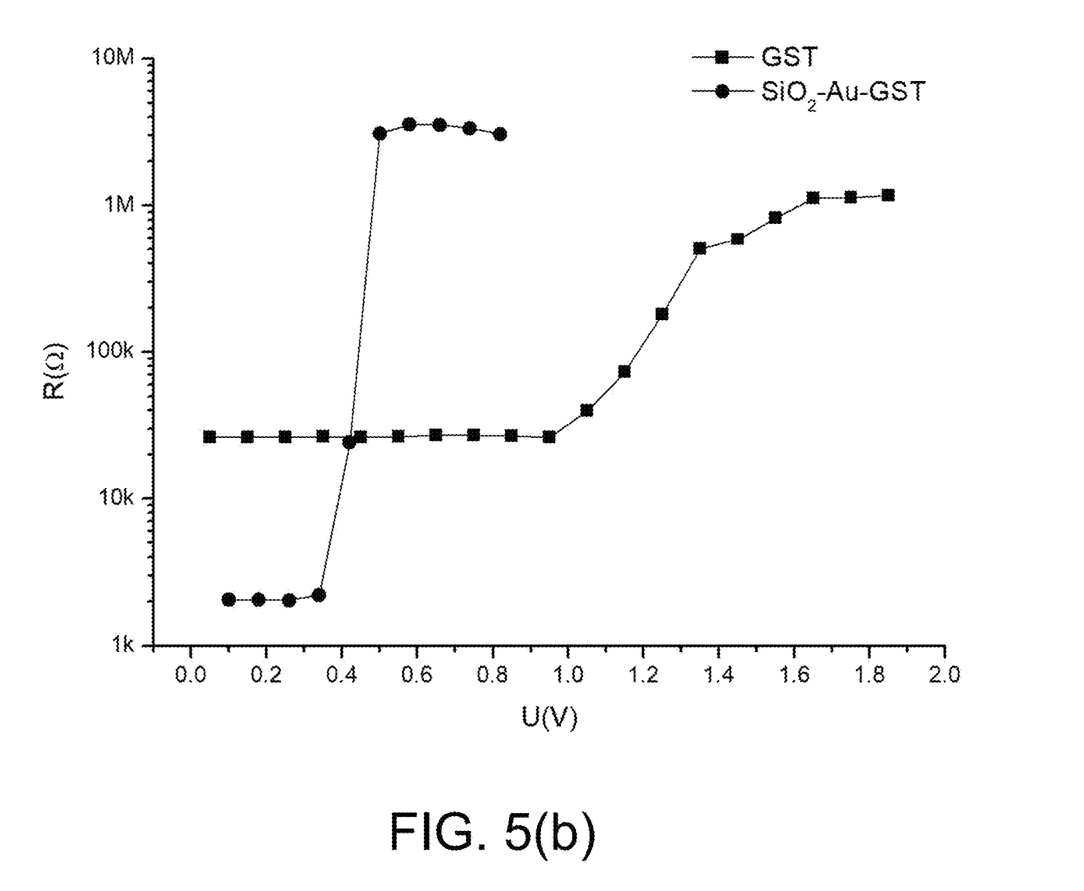
FIG. 5(b) illustrates V-R relationship curves of a phase change memory device with the nano current channel layer containing Au crystal grains made in Example 5 according to the disclosure and a phase change device with the same structure without the layer, where the pulse width of the applied RESET voltage pulse is 50 ns.

FIG. 5(b) is the V-R relationship curves of RESET operations on the device containing the Au nano current channel layer in Example 5 provided by the disclosure and on the conventional structure device (comparison reference). Except for the Au nano current channel layer of 5 nm, the materials and structures of other layers of the two devices are completely the same. Herein, the phase change layer is made of Ge$_2$Sb$_2$Te$_5$ (GST) with a thickness of 100 nm. The device has a hole diameter of 250 nm, the material of the insulating layer is SiO$_2$, and the thickness thereof is 100 nm. The materials of the top and bottom electrodes are TiN, and the thicknesses thereof are 100 nm.

The RESET operation method of the devices is performed as follows. Using a B1500A semiconductor tester, RESET pulses with pulse width of 50 ns, rising edge and falling edge of 10 ns, and gradually-increasing voltage amplitude are applied to the two devices. The result shows that the RESET voltage of the device containing the Au—SiO$_2$ nano current channel layer is 0.5V, and the required power consumption is 1.25*10$^{-4}$ J, while the RESET voltage of the conventional device structure is 1.6V, and the required power consumption is 2.1*10$^{-4}$ J. The comparison between the two shows that with the current channel layer containing Au nano crystal grains, the power consumption required for phase transition of the device can be effectively reduced.

Example 6

Figure 6:
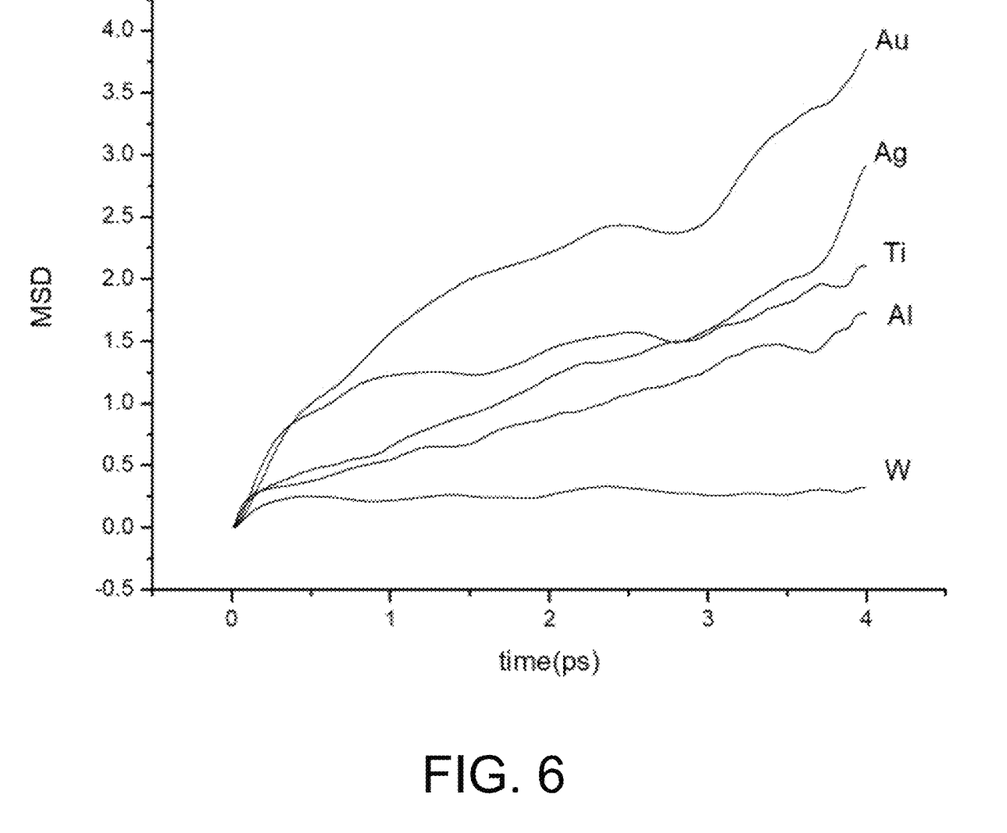
FIG. 6 illustrates the mean square displacements (MSDs) of several kinds of metal atoms running for 4 ps at 1,200K in $SiO_2$ based on VASP Molecular Dynamics calculation in Example 6 according to the disclosure.
Figure 7:
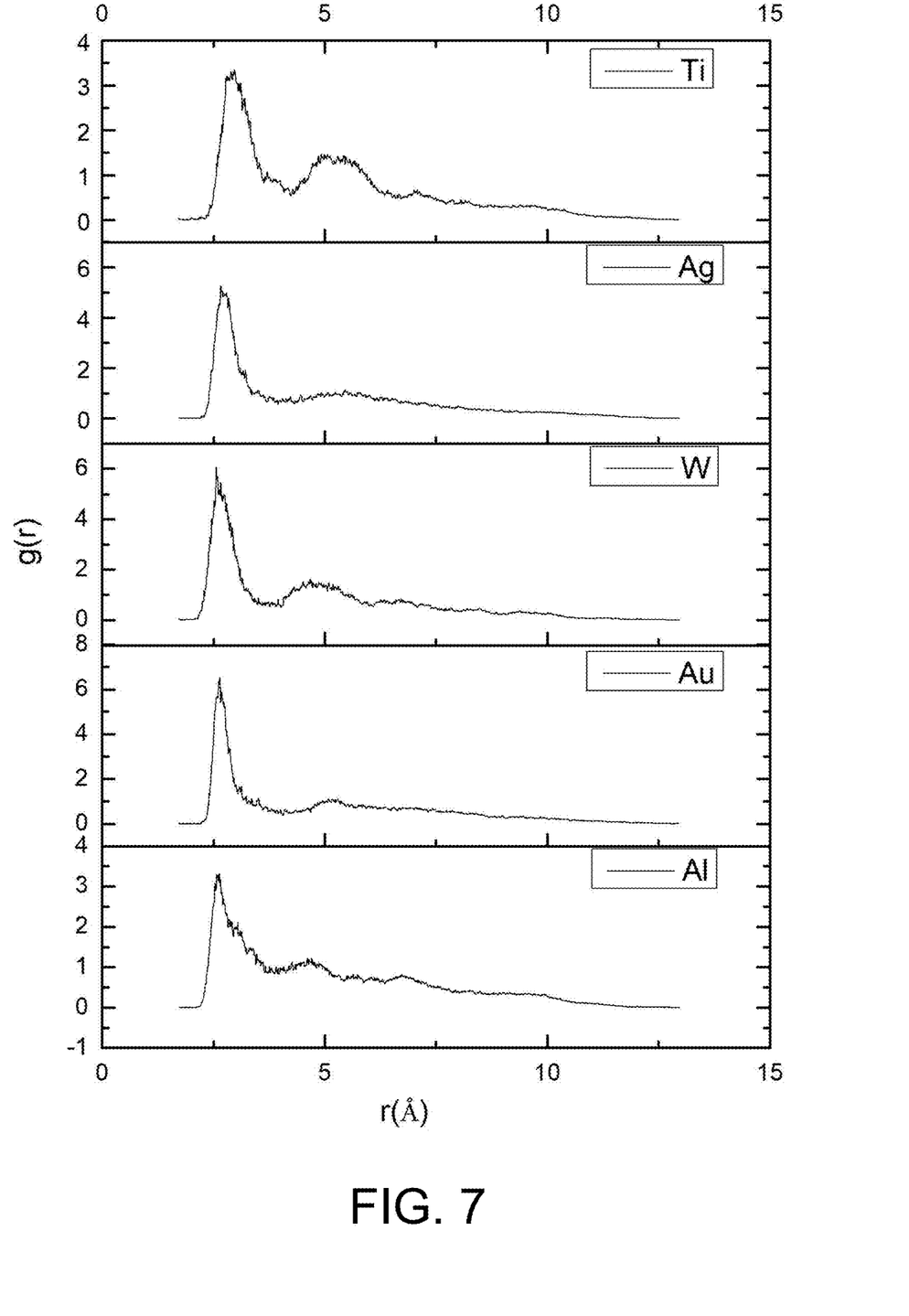
FIG. 7 illustrates radial distribution functions of several kinds of metal atoms running for 10 ps at 1,200K in $SiO_2$ based on VASP Molecular Dynamics calculation in Example 6 according to the disclosure.

According to Example 6 of the disclosure, as shown in FIG. 6 and FIG. 7, the electrically insulating and heat-insulating material and the nano current channel material in the nano current channel layer are selected and matched, so as to ensure that the selected metal conductive material may easily grow and aggregate to form crystal grains in the electrically insulating and heat-insulating material. The selection and matching methods of the two materials are provided as follows.

(1) The electrically insulating and heat-insulating material is selected first. The electrically insulating and heat-insulating material is required to have high electrical resistivity and low thermal conductivity because high electrical resistivity ensures that current may not be conducted in the entire layer and can enter the phase change layer only through the nano current channels, and low thermal conductivity may allow parts of the layer excluding the nano current channels to exhibit thermal barrier effect on heat generation in the phase change layer, heat loss during the SET and RESET process is thereby reduced, and power consumption is further lowered. Selection of the material may also be determined based on experimental conditions. In this example, SiO$_2$ is selected as the electrically insulating and heat-insulating material in the nano current channel layer.

(2) A crystalline SiO$_2$ model is established. VASP software is applied, and the crystalline SiO$_2$ model is heated to 5,000 K to melt, is then cooled to 300 K, and runs for 2 ps to obtain an amorphous SiO$_2$ model.

(3) Calculation of formation energy is performed. In the amorphous SiO$_2$, atoms of a specific nano current channel material to be selected are doped, the structure is optimized, and the structure energy is calculated. The formation energy is calculated through formula $E_f = E_{nx@electrically\ insulating\ and\ heat-insulating\ material} - E_{electrically\ insulating\ and\ heat-insulating\ material} - nE_x$, where $E_{nx@electrically\ insulating\ and\ heat-insulating\ material}$ represents the total energy of the system of n atoms in the electrically insulating and heat-insulating material (SiO$_2$), $E_{electrically\ insulating\ and\ heat-insulating\ material}$ represents the energy of the electrically insulating and heat-insulating material (SiO$_2$), $nE_x$ represents the total atomic potential of doped atoms and n is the number of doped atoms. Normally, if the formation energy is positive, it means that the selected element atoms may aggregate into crystal grains in the selected electrically insulating and heat-insulating material (SiO$_2$ in this example). A larger value of the positive formation energy means that aggregation into crystal grains is easier to be achieved, and the nano current channel may be formed.

(4) Calculation of the mean square displacement (MSD) is performed. In the amorphous SiO$_2$, atoms of a specific nano current channel material to be selected are randomly doped, and the structure is then optimized. The mean square displacement MSD is calculated through molecular dynamics calculation running for 4 ps at 1,200K. The value of the mean square displacement indicates the degree of difficulty for the selected element atoms to migrate in the selected electrically insulating and heat-insulating material (SiO$_2$ in this example). In the same period of time, a larger mean square displacement value indicates that the atoms move more actively in the selected electrically insulating and heat-insulating material, that is, migration may be easily accomplished.

(5) Calculation of the radial distribution function is performed. In the amorphous SiO$_2$, atoms of a specific nano current channel material with a specific proportion (i.e., the ratio of the number of atoms, 12% in this example) are randomly doped into the amorphous SiO$_2$, and the structure is then optimized. The radial distribution function of the doped atoms is calculated through the molecular dynamics calculation running for 10 ps at 1,200K. The peak value of the radial distribution function reflects the degree of aggregation. A larger peak value indicates that the atoms have a higher degree of aggregation in the selected electrically insulating and heat-insulating material and may easily nucleate and form large crystal grains.

(6) The material suitable for growth and aggregation in $SiO_2$ is selected based on comprehensive consideration of the formation energy, mean square displacement, and radial distribution function of atoms in $SiO_2$.

Table 2 shows the calculated formation energy of atoms of several types of nano current channel materials in $SiO_2$, and FIG. 6 shows the mean square displacement MSDs of these material atoms in $SiO_2$ at 1,200K.

TABLE 2

| Ag | Au | Al | W | Ti |
|---|---|---|---|---|
| 0.198 eV | 2.536 eV | −4.548 eV | −5.731 eV | −5.670 eV |

According to the comparison of formation energies, it can be seen that Ag and Au are easier to aggregate and grow than Al, Ti, and W because the formation energies thereof in $SiO_2$ are positive. The mean square displacements of Ag and Au in $SiO_2$ are higher than that of Al, W, and Ti, indicating that Ag and Au are easier to migrate in $SiO_2$ than Al, W, and Ti. It can be seen in the radial distribution functions of FIG. 7 that Au and Ag correspond to higher peak values, and the degrees of aggregation thereof are more obvious. Therefore, Ag and Au are easier to form metal nano crystal grains in $SiO_2$ than other materials and then form the nano current channels.

Example 7: Preparation Method 1 of Nano Current Channel Layer

In the preparation method of the nano current channel layer, a sputtering method can be adopted, and the specific sputtering method is any one of the following four methods. (1) A metal target and an electrically insulating and heat-insulating material target are co-sputtered. (2) A metal target and an electrically insulating and heat-insulating material target are sputtered in an alternating manner. (3) Metal pieces are directly placed on an electrically insulating and heat-insulating material target for doping sputtering. (4) An electrically insulating and heat-insulating material pieces are directly placed on the metal target for doping sputtering.

In this example, the $SiO_2$ nano current channel layer containing Ag crystal grains takes as an example herein, and the nano current channel layer is sputtered by the method of magnetron sputtering. The specific preparation process includes the following steps.

(a) A $SiO_2$ target and an Ag target are put in the sputtering chamber, and the sputtering chamber is evacuated to a vacuum of $10^{-4}$ Pa.

(b) The high-purity Ar gas is used as the sputtering gas, the Ar gas flow is stabilized at 10 sccm, the sputtering pressure is adjusted to 0.5 Pa, and the distance between the target and the substrate is 120 mm.

(c) The radio frequency (RF) sputtering power supply is set to 200 W and the RF sputtering power supply is connected to the $SiO_2$ target, sputtering is performed for 100 s, and the RF power supply is turned off after 2 nm $SiO_2$ thin film is obtained. The direct current sputtering power supply is set to 30 W and the direct current sputtering power supply is connected to the Ag target, sputtering is performed for 10 s, the direct current power supply is turned off after 1 nm Ag layer is obtained, the RF power supply is then turned on again to sputter $SiO_2$ for 100 s, and the power supply is turned off after 2 nm $SiO_2$ layer is obtained.

(d) The film obtained by sputtering is put into a vacuum annealing furnace, and the annealing furnace is heated to 400° C. at a rate of 15° C./min and is kept at 400° C. for 30 min. The metal Ag atoms agglomerate and nucleate in $SiO_2$ and forms nano metal crystal grains that penetrate the thickness of the $SiO_2$ layer, as shown in FIG. 4(a).

The annealing temperature and holding time in step (d) may be optimized according to the thickness ratio of the $SiO_2$ layer to the Ag layer. If the thickness ratio increases, higher annealing temperature and longer holding time are required. The goal of optimization is to allow the metal Ag atoms to agglomerate in $SiO_2$ and to form nano metal crystal grains that penetrate the thickness of the $SiO_2$ layer.

Example 8: Preparation Method 2 of Nano Current Channel Layer

In a preparation method of the nano current channel layer, a sputtering method may be adopted, and the specific sputtering method is any one of the following four methods. (1) A metal target and an electrically insulating and heat-insulating material target are co-sputtered. (2) A metal target and an electrically insulating and heat-insulating material target are sputtered in an alternating manner. (3) Metal pieces are directly placed on an electrically insulating and heat-insulating material target for doping sputtering. (4) An electrically insulating and heat-insulating material pieces are directly placed on a metal target for doping sputtering.

In this example, the $SiO_2$ nano current channel layer containing Au crystal grains takes as an example herein, and the nano current channel layer 30 is sputtered by the method of magnetron sputtering. The specific preparation process includes the following steps.

(a) 8 pieces of 1cm*0.5 cm size Au pieces are placed on the etching ring on the surface of the $SiO_2$ target and the chamber is evacuated to $10^{-4}$ Pa.

(b) The high-purity Ar gas is used as the sputtering gas, the Ar gas flow is stabilized at 10 sccm, the sputtering pressure is adjusted to 0.5 Pa, and the distance between the target and the substrate is 120 mm.

(c) The RF sputtering power supply is set to 200 W, and sputtering is performed for 200 s.

(d) The film obtained by sputtering is put into a vacuum annealing furnace, and the annealing furnace is heated to 400° C. at a rate of 15° C./min and is kept at 400° C. for 30 min. The metal Au atoms agglomerate and nucleate in the $SiO_2$ layer and forms nano metal crystal grains that penetrate the thickness of the $SiO_2$ layer, as shown in FIG. 5(a).

The annealing temperature and holding time in step (d) may be optimized according to the number of Au pieces (or the area of the Au pieces covering the etching ring). If the number of Au pieces is reduced (the area covering the etching ring is decreased), higher annealing temperature and longer holding time are required. The goal of optimization is to allow the metal Au atoms to agglomerate in the $SiO_2$ layer and to form nano metal crystal grains that penetrate the thickness of the $SiO_2$ layer.

In the co-sputtering method provided by this example, the subsequent annealing process may also be replaced by elevating the temperature of the substrate during the sputtering process. Higher temperature is beneficial to increasing the kinetic energy for metal atom migration and may facilitate the aggregation of metal atoms and the growth of crystal grains. The goal is also to form nano metal crystal grains that penetrate the thickness of the nano current channel layer.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A phase change memory device based on a nano current channel, comprising a nano current channel layer disposed between a phase change layer and an electrode layer, wherein the nano current channel layer is an electrically insulating and heat-insulating layer containing metal nano crystal grains penetrating a film thickness of the layer, the metal nano crystal grains directly connect the electrode layer and the phase change layer, a current reaches the phase change layer from the electrode layer only through nano current channels formed by the metal nano crystal grains, the phase change layer connects the electrode layer only through the metal nano crystal grains.

2. The phase change memory device according to claim 1, wherein the nano current channel layer is a film structure formed by an electrically insulating and heat-insulating material and the metal nano crystal grains embedded in the electrically insulating and heat-insulating material, and the metal nano crystal grains penetrate the layer to form the nano current channels.

3. The phase change memory device according to claim 1, wherein the phase change memory device further comprises: a first electrode layer, a second electrode layer, and a phase change material layer,
    wherein the first electrode layer is adjacent to the phase change material layer, the phase change material layer is adjacent to the nano current channel layer, and the second electrode layer is adjacent to the nano current channel layer,
    wherein the nano current channel layer is a single insulating layer containing the metal nano crystal grains penetrating the entire layer.

4. The phase change memory device according to claim 1, wherein a material of the metal nano crystal grains is at least one of elementary substance metal materials selected from Fe, Pt, W, Cu, Zn, Al, Ni, Ti, Au, and Ag, or is an alloy material formed of any two or more of elementary substance metal materials selected from Fe, Pt, W, Cu, Zn, Al, Ni, Ti, Au, and Ag, or is a compound with good conductivity containing an elementary substance metal material selected from Fe, Pt, W, Cu, Zn, Al, Ni, Ti, Au, and Ag.

5. The phase change memory device according to claim 2, wherein the metal nano crystal grains of the nano current channel layer exhibit larger electrical conductivity than the electrically insulating and heat-insulating material.

6. The phase change memory device according to claim 2, wherein the electrically insulating and heat-insulating material has low thermal conductivity, and the electrically insulating and heat-insulating material is any one of silicon oxide, silicon nitride, aluminum oxide, aluminum nitride, zinc oxide, tungsten oxide, titanium oxide, boron nitride, and silicon carbide.

7. The phase change memory device according to claim 1, wherein a thickness of the nano current channel layer is 1 nm to 30 nm.

8. The phase change memory device according to claim 1, wherein a size of the metal nano crystal grains in the insulating and heat-insulating layer is 1 nm to 30 nm, and the size of the metal nano crystal grains in a direction perpendicular to film surface is not less than the thickness of the nano current channel layer.

9. The phase change memory device according to claim 3, wherein the phase change material layer is made of chalcogenide compound, and the chalcogenide compound includes an alloy compound formed by any one of S, Se, and Te and other non-chalcogenide materials, wherein the non-chalcogenide materials include one or more of Ge, Sb, Ga, Bi, In, Sn, Pb, Ag, N, and O.

10. The phase change memory device according to claim 3, wherein phase change material layer comprises GeTe, GeSb, $Ge_2Sb_2Te_5$, $Ge_1Sb_2Te_4$, $Sb_2Te_3$, AgInSbTe, superlattice-like phase change material or a heterostructure phase change material containing chalcogenide compound comprising $(GeTe)/(Sb_2Te_3)$, $(GeTe)/(Bi_2Te_3)$, $(Sb_2Te_3)/(TiTe_2)$, GeTe/Sb, (Ge—Sb—Te)/(Sb—Te), or (Ge—Sb—Te)/C.

11. The phase change memory device according to claim 3, wherein the phase change material layer comprises a compound formed by doping or modifying a chalcogenide compound, wherein a dopant element comprises at least one of C, N, O, Cu, Cr, Sc, and Ti.

12. The phase change memory device according to claim 3, wherein the phase change material layer comprises single-element phase change material Sb or Te.

13. The phase change memory device according to claim 3, wherein a thickness of the phase change material layer is 20 nm to 200 nm.

14. The phase change memory device according to claim 3, wherein a material of the first electrode layer and a material of the second electrode layer comprise metal elementary substances, a metal alloy thereof, and a metal compound.

15. The phase change memory device according to claim 3, wherein a thickness of the first electrode layer and a thickness of the second electrode layer are 20 nm to 300 nm.

* * * * *